(12) United States Patent
Lee

(10) Patent No.: US 7,760,561 B2
(45) Date of Patent: Jul. 20, 2010

(54) CIRCUIT AND METHOD FOR OUTPUTTING DATA IN SEMICONDUCTOR MEMORY APPARATUS

(75) Inventor: Hyung Dong Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 868 days.

(21) Appl. No.: 11/638,454

(22) Filed: Dec. 14, 2006

(65) Prior Publication Data
US 2007/0182453 A1 Aug. 9, 2007

(30) Foreign Application Priority Data
Feb. 9, 2006 (KR) .................. 10-2006-0012359

(51) Int. Cl.
*G11C 7/22* (2006.01)
(52) U.S. Cl. ................................. 365/189.15
(58) Field of Classification Search ............ 365/189.15, 365/185.23, 230.06, 221, 220, 189.11; 327/108
See application file for complete search history.

(56) References Cited

U.S. PATENT DOCUMENTS

| 6,163,178 | A * | 12/2000 | Stark et al. ................ 327/108 |
| 6,255,867 | B1 | 7/2001 | Chen |
| 6,256,235 | B1 * | 7/2001 | Lee .................. 365/189.11 |
| 6,262,606 | B1 * | 7/2001 | Tamjidi ................... 327/108 |
| 6,421,297 | B1 * | 7/2002 | Huber ................. 365/230.06 |
| 6,519,189 | B2 | 2/2003 | Jung |
| 6,583,659 | B1 * | 6/2003 | Kwong et al. ............... 327/295 |
| 6,653,873 | B1 * | 11/2003 | Nguyen ................... 327/112 |
| 6,707,722 | B2 | 3/2004 | Ho et al. |
| 6,735,128 | B2 | 5/2004 | Kim |
| 6,914,829 | B2 | 7/2005 | Lee |
| 6,970,015 | B1 | 11/2005 | Chan et al. |
| 7,026,848 | B2 | 4/2006 | Wang et al. |

(Continued)

FOREIGN PATENT DOCUMENTS

CN 1684368 10/2005

(Continued)

OTHER PUBLICATIONS

Office Action dated Feb. 10, 2009 for Taiwan Application No. 95148017.

*Primary Examiner*—VanThu Nguyen
*Assistant Examiner*—Douglas King
(74) *Attorney, Agent, or Firm*—Venable LLP; Jeffri A. Kaminski

(57) ABSTRACT

A data output circuit of a semiconductor memory apparatus includes a pre-driver generating pull-up and down signals from driving rising and falling data in active periods of rising and falling clocks, respectively, in accordance with a state of an output enable signal. A main driver generates last output data to a common node from the pull-up and down signals. An assistant pre-driver generates an assistant drive signal, which is activated when the rising data disagrees with the falling data, in correspondence with inputs of the rising data, the falling data, the rising clock, the falling clock, and a pipe output control signal. An assistant main driver generates assistant last output data to the common node from the pull-up and down signals in accordance with a state of the assistant drive signal.

23 Claims, 7 Drawing Sheets

U.S. PATENT DOCUMENTS

| | | |
|---|---|---|
| 7,053,679 B2 | 5/2006 | Rho |
| 2002/0086477 A1* | 7/2002 | Jung .......................... 438/200 |
| 2005/0057983 A1 | 3/2005 | Chun |
| 2005/0068071 A1* | 3/2005 | Waldrop ..................... 327/112 |
| 2005/0195005 A1 | 9/2005 | Choi et al. |
| 2005/0200379 A1 | 9/2005 | Lee |
| 2005/0263910 A1 | 12/2005 | Maeda et al. |

FOREIGN PATENT DOCUMENTS

| | | |
|---|---|---|
| JP | 2005073269 | 3/2005 |
| JP | 2005354586 | 12/2005 |
| JP | 2006042137 | 2/2006 |
| JP | 2006081183 | 3/2006 |
| TW | I228259 | 2/2005 |

* cited by examiner

CIRCUIT AND METHOD FOR OUTPUTTING DATA IN SEMICONDUCTOR MEMORY APPARATUS

CROSS-REFERENCE TO RELATED APPLICATIONS

This U.S. non-provisional patent application claims priority under 35 U.S.C. §119 of Korean Patent Application No. 2006-012359 filed on Feb. 9, 2006, the entire contents of which are hereby incorporated by reference.

BACKGROUND

The present invention disclosed herein relates to semiconductor memory apparatuses, and more particularly, to a data output circuit and method for strengthening the drivability of a semiconductor memory apparatus when the last output data transitions in voltage level.

Data input/output operations of a synchronous dynamic RAM (SDRAM) are usually carried out in sync with rising edges of a clock signal. Meanwhile, in a double data rate SDRAM (DDR SDRAM), input/output operations are conducted in sync with falling edges as well as rising edges of a clock signal, hence the speed of data input/output operations are double that of a typical SDRAM. Thus, a high-frequency semiconductor memory apparatus like DDR SDRAM is configured to generate a clock (hereinafter, rising clock) enabled at a rising edge of a clock signal output from a delay locked loop (DLL) circuit during a data output operation, and a clock (hereinafter, falling clock) enabled at a falling edge of the clock signal of the DLL circuit. Then, after storing data (hereinafter, rising data) output when the rising clock is activated and data (hereinafter, falling data) output when the falling clock is activated to a pipe register, the data is output from the pipe register in sequence to accomplish a high-frequency data output operation.

A conventional data output circuit will be described with reference to FIGS. 1 and 2 as follows.

FIG. 1 is a block diagram showing a structure of a conventional data output circuit in a conventional semiconductor memory apparatus, which outputs four bits of data.

The data output circuit shown in FIG. 1 is comprised of a pipe register 10 storing four bits of data DATA<0:3> at a time and alternately outputting rising and falling data RDATA and FDATA in response to four pipe output control signals POUT<0:3>; a pre-driver 20 generating pull-up and pull-down signals PLLUP and PLLDN from driving the rising data RDATA in active periods of a rising clock RCLK and the falling data FDATA in active periods of a falling clock FCLK in accordance with the state of an output enable signal OE; and a main driver 30 generating a last output data ODATA in response to inputs of the pull-up and pull-down signals PLLUP and PLLUP.

The pipe register 10 stores the four input data bits DATA<0:3> at the same time. After storing the data, when the pipe output control signal POUT<0> is activated, the rising data bit RDATA<0> is output from the pipe register 10. When the pipe output control signal POUT<1> is activated, the falling data bit FDATA<0> is output from the pipe register 10. When the pipe output control signal POUT<2> is activated, the rising data bit RDATA<1> is output from the pipe register 10. When the pipe output control signal POUT<3> is activated, the falling data bit FDATA<1> is output from the pipe register 10.

The pre-driver 20 drives the rising and falling data RDATA and FDATA only in an active period of the output enable signal OE. When the output enable signal OE is inactivated, the pull-up and pull-down signals PLLUP and PLLDN output from the pre-driver 20 are each fixed to high and low levels respectively, without being influenced by the rising and falling data RDATA and FDATA. But, when the output enable signal OE is activated, the pre-driver 20 drives the rising and falling data RDATA and FDATA at active periods of the rising and falling clocks RCLK and FCLK, respectively. When this occurs, the pipe output control signals POUT<0> and POUT<2> are generated from the rising clock RCLK, while the pipe output control signals POUT<1> and POUT<3> are generated from the falling clock FCLK. Thus, when the rising and falling clocks RCLK and FCLK are activated, the rising data bits RDATA<0>, RDATA<1>, RDATA<2>, and RDATA<3> are driven in sequence. When this occurs, the pull-up and pull-down signals PLLUP and PLLDN output from the pre-driver 20 are at the same logical value.

The voltage level of the last output data ODATA generated from the main driver 30 is determined by the voltage levels of the pull-up and pull-down signals PLLUP and PLLDN. But, if a high level pull-up signal PLLUP and a low level pull-down signal PLLDN are applied to the main driver 30 when the output enable signal OE is inactive, the voltage level of the last output data ODATA is in a floating state and thus regarded as being invalid for data.

FIG. 2 is a timing diagram illustrating an operation of the data output circuit shown in FIG. 1.

From FIG. 2, it can be seen that the pipe output control signals POUT<0:3> are sequentially activated in response to the rising and falling clocks RCLK and FCLK which are generated from a DLL clock DLL_CLK. Responding to the sequential activation of the pipe output control signals POUT<0:3>, the four bits of the input data DATA<0:3> are generated as the rising data bit RDATA<0>, the falling data bit FDATA<0>, the rising data bit RDATA<1>, and the falling data bit FDATA<1>, respectively. Then, if the output enable signal OE is activated, the pull-up and pull-down signals, PLLUP and PLLDN, are generated with predetermined levels from the rising data bit RDATA<0>, the falling data bit FDATA<0>, the rising data bit RDATA<1>, and the falling data bit FDATA<1>. The pull-up and pull-down signals PLLUP and PLLDN define the logical value of the last output data ODATA.

However, in the data output circuit operating in the aforementioned mode, time is required for varying the value of the last output data ODATA, i.e., transitioning the voltage level of the last output data ODATA. The time requirement is caused by an internal impedance of the data output circuit. When the data output circuit is operating at high frequency, it is also necessary to transition the level of the last output data ODATA at high frequency. However, since the impedance is constant, it is difficult for the last output data ODATA to reach its correct target level.

SUMMARY OF THE INVENTION

Embodiments of the present invention provide a circuit and method for outputting data having an assistant data output driver, enabling a faster time for reaching a target level of the last output data bit, in a semiconductor memory apparatus.

An embodiment of the present invention provides a data output circuit of a semiconductor memory apparatus including: a pre-driver configured to generate pull-up and pull-down signals by driving rising and falling data in active periods of rising and falling clocks, respectively, in response to a state of an output enable signal; a main driver configured to generate last output data, by the pull-up and pull-down signals, thereby outputting the last output data to a common node; an assistant pre-driver configured to generate an assistant drive signal, which is activated when the rising data is different from the falling data, in response to inputs of the rising data, the falling data, the rising clock, the falling clock, and a pipe output control signal; and an assistant main driver configured to generate assistant last output data by the pull-up and pull-down signals in response to a state of the assistant drive signal, thereby outputting the assistant last output data to the common node.

Another embodiment of the present invention provides a data output circuit of a semiconductor memory apparatus including: generating an assistant drive signal by determining a level transition of a last output data of a main driver; and generating and outputting an assistant last output data, in accordance with the state of the assistant drive signal; wherein a logical value of the assistant last output data is same that of the last output data.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
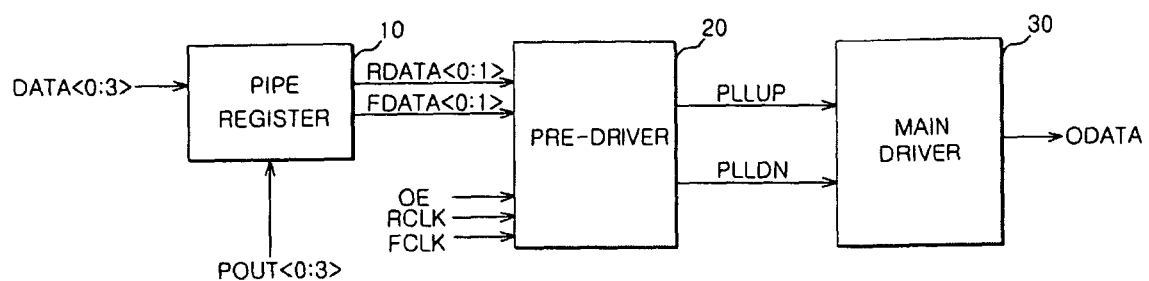
FIG. 1 is a block diagram showing a structure of a conventional data output circuit in a conventional semiconductor memory device.
Figure 2:
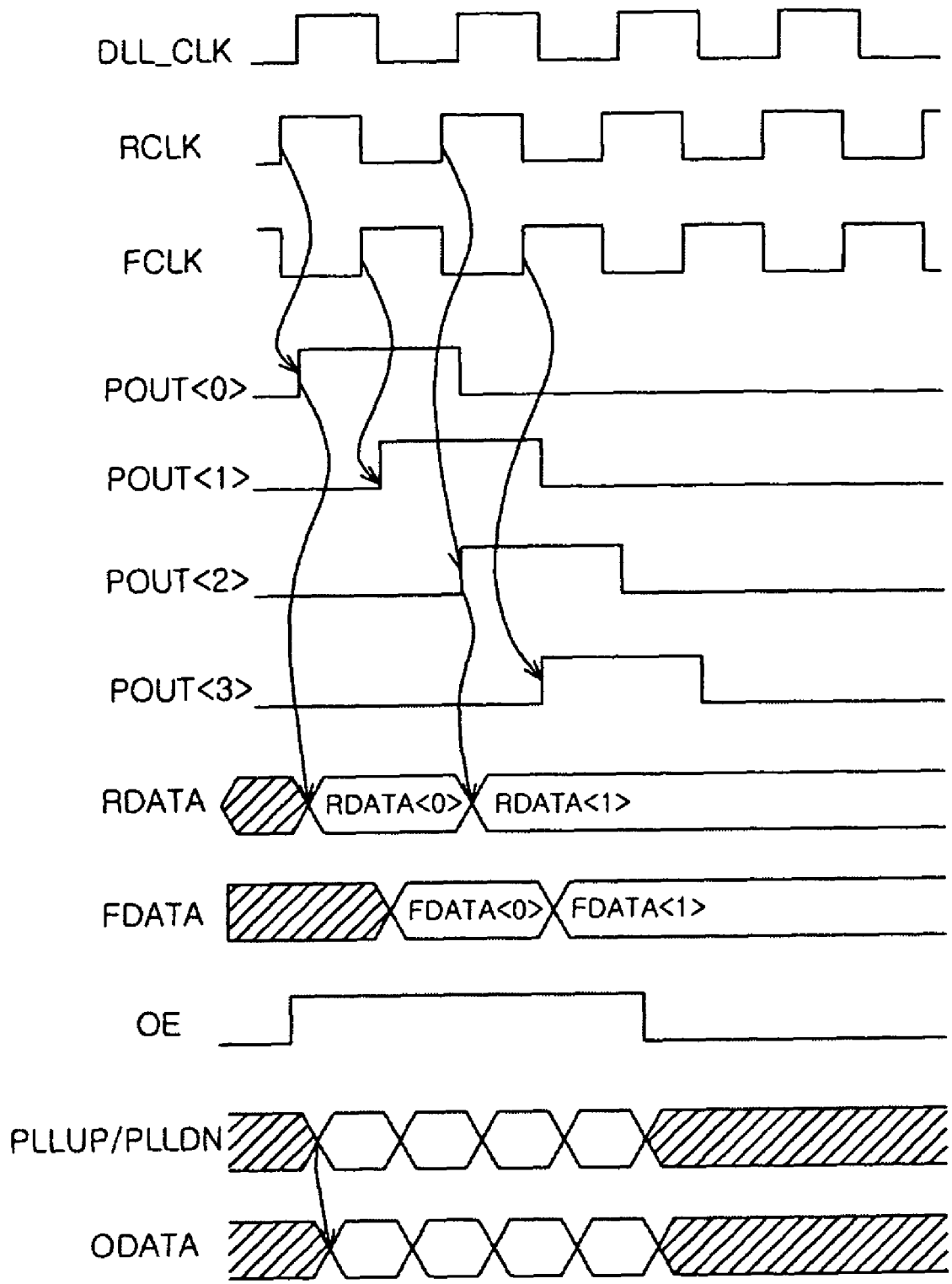
FIG. 2 is a timing diagram illustrating an operation of the data output circuit shown in FIG. 1.

Preferred embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 3:
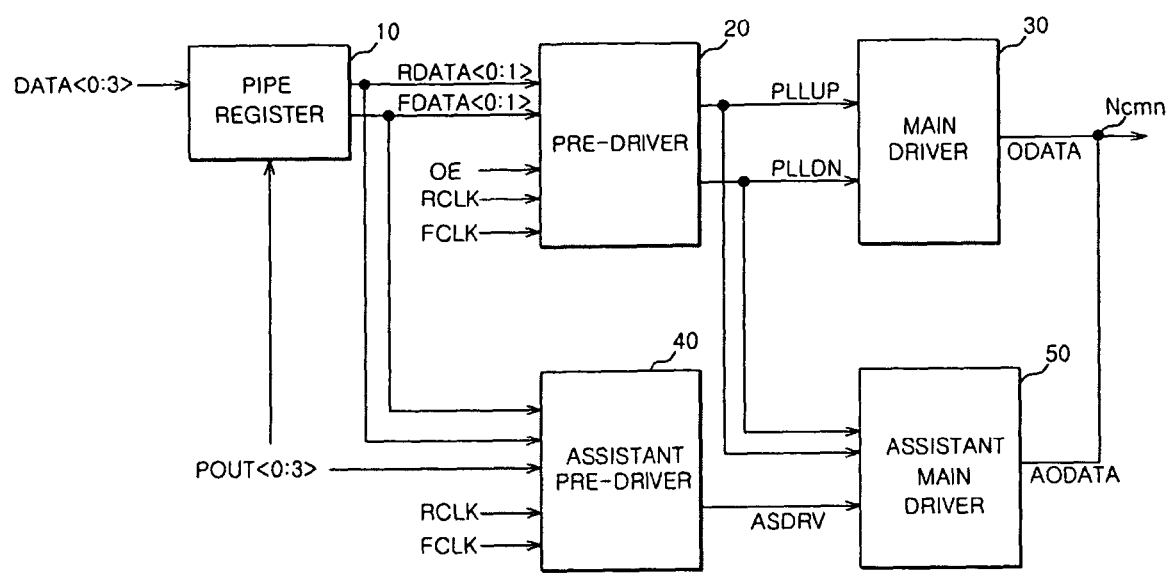
FIG. 3 is a block diagram showing a structural feature of a data output circuit for a semiconductor memory device in accordance with an embodiment of the present invention.

FIG. 3 is a block diagram showing a structural feature of a data output circuit for a semiconductor memory apparatus in accordance with an embodiment of the present invention, exemplarily illustrating a case of outputting four data bits. But, a data output circuit in accordance with the present embodiment is not limited to the description or illustration herein of the number of data bits to be output.

The data output circuit shown in FIG. 3 includes a pipe register 10, a pre-driver 20, a main driver 30, an assistant pre-driver 40, and an assistant main driver 50. The pipe register 10 stores four data bits DATA<0:3> at a time and alternately outputs rising and falling data RDATA and FDATA in response to four bits of pipe output control signals POUT<0:3>. That is, the pipe register 10 stores the four input data bits DATA<0:3> at the same time. After storing the data, when the pipe output control signal POUT<0> is activated, the rising data bit RDATA<0> is output from the pipe register 10. When the pipe output control signal POUT<1> is activated, the falling data bit FDATA<0> is output from the pipe register 10. When the pipe output control signal POUT<2> is activated, the rising data bit RDATA<1> is output from the pipe register 10. When the pipe output control signal POUT<3> is activated, the falling data bit FDATA<1> is output from the pipe register 10.

The pre-driver 20 generates pull-up and pull-down signals PLLUP and PLLDN from driving the rising data RDATA in active periods of a rising clock RCLK and the falling data FDATA in active periods of a falling clock FCLK, in response to the state of an output enable signal OE. That is, the pre-driver 20 drives the rising and falling data RDATA and FDATA only in an active period of the output enable signal OE. When the output enable signal OE is inactivated, the pull-up and pull-down signals PLLUP and PLLDN output from the pre-driver 20 are fixed to high and low levels respectively, without being influenced by the rising and falling data RDATA and FDATA. But, when the output enable signal OE is activated, the pre-driver 20 drives the rising and falling data RDATA and FDATA at active periods of the rising and falling clocks RCLK and FCLK, respectively. At this time, the pipe output control signals POUT<0> and POUT<2> are generated from the rising clock RCLK, while the pipe output control signals POUT<1> and POUT<3> are generated from the falling clock FCLK. Thus, when the rising and falling clocks RCLK and FCLK are activated, the rising data bits RDATA<0>, RDATA<1>, RDATA<2>, and RDATA<3> are driven in sequence. When this occurs, the pull-up and pull-down signals PLLUP and PLLDN output from the pre-driver 20 are at the same logical value.

The main driver 30 generates a last output data ODATA by inputs of the pull-up and pull-down signals PLLUP and PLLDN, and outputs the last output data ODATA to a common node Ncmn. That is, a voltage level of the last output data ODATA generated from the main driver 30 is determined by the voltage levels of the pull-up and pull-down signals PLLUP and PLLDN. But, if a high level pull-up signal PLLUP and a low level pull-down signal PLLDN are applied to the main driver 30 when the output enable signal OE is inactive, the voltage level of the last output data ODATA is in a floating state and thus regarded as being invalid for data.

The assistant pre-driver 40 generates an assistant drive signal ASDRV, which is activated when the rising data RDATA is different from the falling data FDATA in logical value, in response to the rising data RDATA, the falling data FDATA, the rising clock RCLK, the falling clock FCLK, and the four pipe output control signals POUT<0:3>. Here, the fact that the rising data RDATA is different from the falling data FDATA in logical value means there are variations in the last output data ODATA. This is because the rising and falling data, RDATA and FDATA, are alternately input to the pre-driver 20. The assistant pre-driver 40 activates the assistant drive signal ASDRV when the logical value of the rising data RDATA is different from that of the falling data FDATA.

The assistant main driver 50 generates assistant last output data AODATA by inputs of the pull-up and pull-down signals PLLUP and PLLDN in response to the state of the assistant drive signal ASDRV, and outputs the assistant last output data AODATA to the common node Ncmn. That is, the assistant main driver 50 generates assistant last output data AODATA in response to the pull-up and down signals PLLUP and PLLDN. When the assistant drive signal ASDRV is active, the assistant last output data AODATA has the same logical value as the last output data ODATA from the main driver 30. Thus, the substantial voltage level of the data output is determined by the assistant last output data AODATA along with the last output data ODATA, and thereby reaching a voltage level corresponding to a target value much faster than in the prior art. Otherwise, when the assistant drive signal ASDRV is inactive, the voltage level of the assistant last output data AODATA is in a floating state and hence regarded as being invalid for data.

Figure 4:
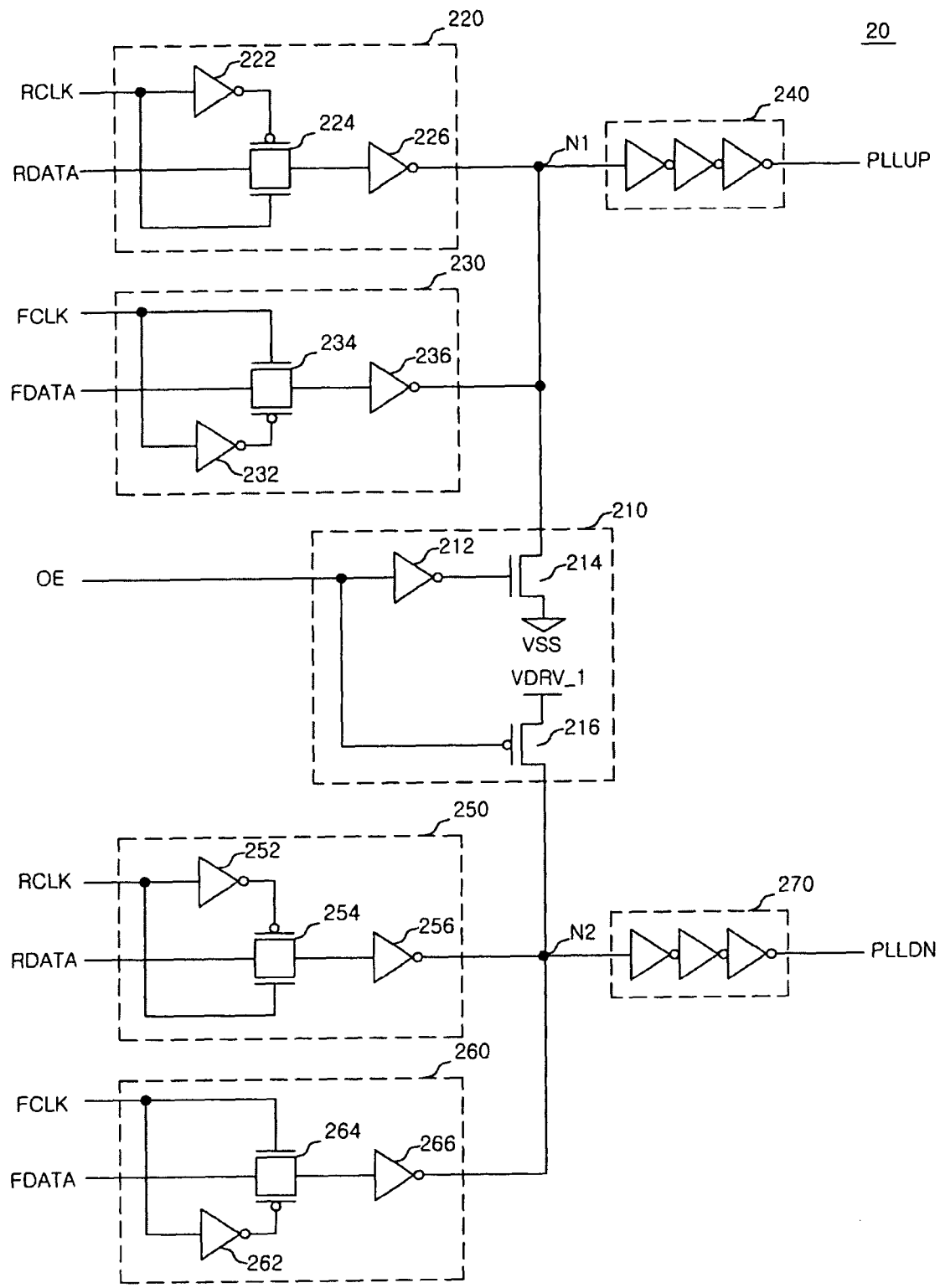
FIG. 4 is a circuit diagram illustrating a detailed structure of the pre-driver shown in FIG. 3.

FIG. 4 is a circuit diagram illustrating a detailed structure of the pre-driver 20 shown in FIG. 3.

The pre-driver 20 includes an output enable signal input section 210, a first switching section 220, a second switching section 230, a pull-up signal generating section 240, a third switching section 250, a fourth switching section 260, and a pull-down signal generating section 270. The output enable signal input section 210 determines the start of an operation of the pre-driver 20 in response to the output enable signal OE. The first switching section 220 transfers the rising data RDATA to a node N1 in response to the rising clock RCLK. The second switching section 230 transfers the falling data FDATA to a node N1 in response to the falling clock FCLK. The pull-up signal generating section 240 generates the pull-up signal PLLUP from driving a signal transferred to the node N1. The third switching section 250 transfers the rising data RDATA to a node N2 in response to the rising clock RCLK. The fourth switching section 260 transfers the falling data FDATA to the node N2 in response to the falling clock FCLK. The pull-down signal generating section 270 generates the pull-down signal PLLDN from driving a signal transferred to the node N2.

The output enable signal input section 210 includes: a first inverter 212 logically inverting the output enable signal OE; a first transistor 214 with its gate terminal receiving an output signal of the first inverter 212, its drain terminal connected to the node N1, and its source terminal supplied with a ground voltage VSS; and a second transistor 216 with its gate terminal receiving an output signal of the first inverter 212, its source terminal supplied with a first drive voltage Vdrv_1, and its drain terminal connected to the node N2.

The first drive voltage Vdrv_1 is provided to define the voltage of the high level for the pull-up and pull-down signals PLLUP and PLLDN, which may be established by an external power supply voltage, but is not limited hereto.

The first switching section 220 is composed of a second inverter 222 logically inverting the rising clock RCLK; a first pass gate 224 receiving the rising clock RCLK and an output signal of the second inverter 222 through its gate terminals and passing the rising data RDATA therethrough when the rising clock RCLK is high level; and a third inverter 226 logically inverting an output signal of the first pass gate 224 and transferring the inverted signal to the node N1.

Similarly, the second switching section 230 includes a fourth inverter 232 logically inverting the falling clock FCLK; a second pass gate 234 receiving the falling clock FCLK and an output signal of the fourth inverter 232 through its gate terminals and passing the falling data FDATA therethrough when the falling clock FCLK is high level; and a fifth inverter 236 logically inverting an output signal of the second pass gate 234 and transferring the inverted signal to the node N1.

The pull-up signal generating section 240 includes an odd number of inverters for logically inverting and driving the signal transferred to the node N1.

The third switching section 250 includes a sixth inverter 252 logically inverting the rising clock RCLK; a third pass gate 254 receiving the rising clock RCLK and an output signal of the sixth inverter 252 through its gate terminals and passing the rising data RDATA therethrough when the rising clock RCLK is high level; and a seventh inverter 256 logically inverting an output signal of the third pass gate 254 and transferring the inverted signal to the node N2.

Similarly, the fourth switching section 260 includes an eighth inverter 262 logically inverting the falling clock FCLK; a fourth pass gate 264 receiving the falling clock FCLK and an output signal of the eighth inverter 262 through its gate terminals and passing the falling data FDATA therethrough when the falling clock FCLK is high level; and a ninth inverter 266 logically inverting an output signal of the fourth pass gate 264 and transferring the inverted signal to the node N2.

The pull-down signal generating section 270 includes an odd number of inverters for logically inverting and driving the signal transferred to the node N2.

If the output enable signal OE is inactivated, the first and second transistors 214 and 216 of the output enable signal input section 210 are turned on. Then, the voltage level of the node N1 becomes the level of the ground voltage VSS, while the voltage level of the node N2 becomes the level of the first drive voltage Vdrv_1. Thus, the pull-up signal PLLUP is set at high level, while the pull-down signal PLLDN is set at low level.

To the contrary, if the output enable signal OE is activated, the first and second transistors 214 and 216 are turned off so the voltage levels of the nodes N1 and N2 are determined by output signals of the first through fourth switching sections 220, 230, 250, and 260.

In a high level period of the rising clock RCLK, the first and third pass gates 224 and 254 of the first and third switching sections 220 and 250 are turned on to logically invert the rising data RDATA with the third and seventh inverters 226 and 256. The inverted rising data are transferred to the nodes N1 and N2. Thereafter, the signals transferred to the nodes N1 and N2 are each logically inverted and driven by the pull-up and pull-down signal generating sections 240 and 270, resulting in the pull-up and pull-down signals PLLUP and PLLDN respectively.

To the contrary, in a period that the rising clock RCLK is at low level and the falling clock FCLK is at high level, the second and fourth pass gates 234 and 264 of the second and fourth switching sections 230 and 260 are turned on to logically invert the falling data FDATA with the fifth and ninth inverters 236 and 266. The inverted falling data are each transferred to the nodes N1 and N2. Thereafter, the signals transferred to the nodes N1 and N2 are each logically inverted and driven by the pull-up and pull-down signal generating sections 240 and 270, resulting in the pull-up and pull-down signals PLLUP and PLLDN respectively.

Figure 5:
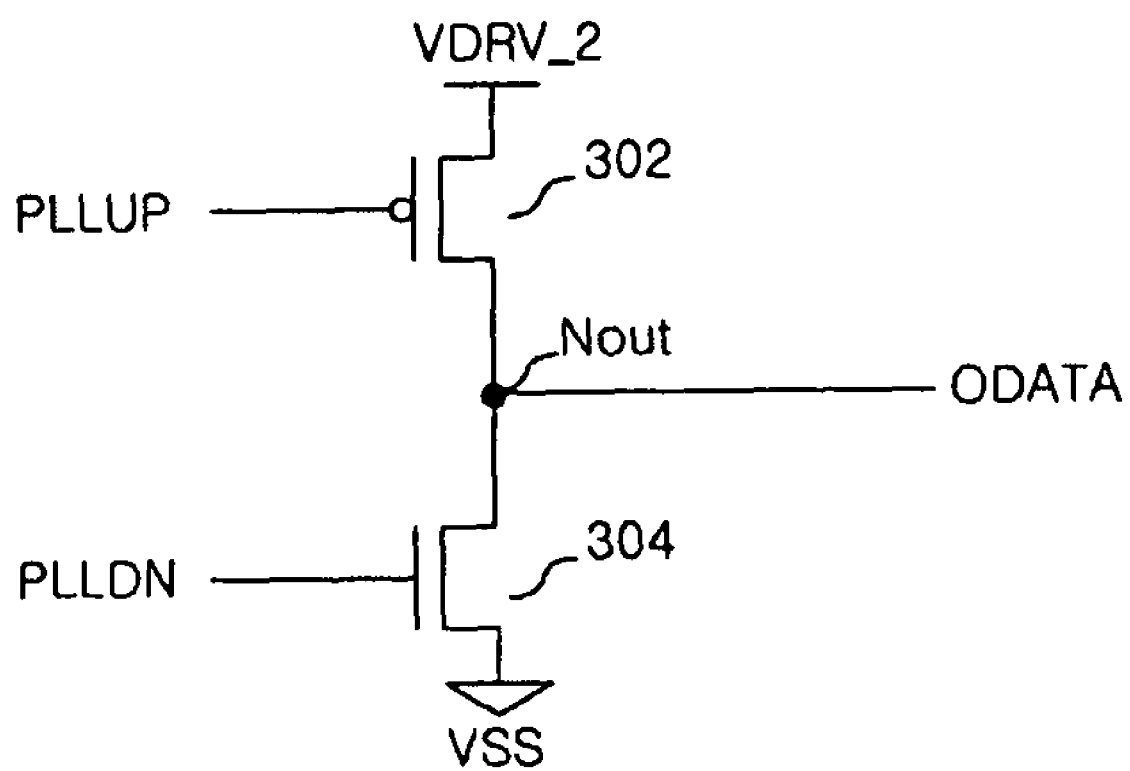
FIG. 5 is a circuit diagram illustrating a detailed structure of the main driver shown in FIG. 3.

FIG. 5 is a circuit diagram illustrating a detailed structure of the main driver 30 shown in FIG. 3.

As shown in FIG. 5, the main driver 30 is composed of a third transistor 302 with its gate terminal coupled with the pull-up signal PLLUP, its source node supplied with a second drive voltage Vdrv_2, and its drain terminal connected to an output node Nout; and a fourth transistor 304 with its gate terminal coupled with the pull-down signal PLLDN, its source terminal supplied with the ground voltage VSS, and its drain terminal connected to the output terminal Nout.

The second drive voltage Vdrv_2 is provided to define the voltage of the high level for the last output data ODATA generated through the output node Nout. The second drive voltage Vdrv_2 may be implemented by the external power supply voltage, but is not limited hereto.

When the pull-up signal PLLUP is high level and the pull-down signal PLLDN is low level, i.e., when the output enable signal OE input to the pre-driver 20 is inactivated, the third and fourth transistors 302 and 304 are turned off. Thereby, the voltage level of the output node Nout is in a floating state and hence the last output data ODATA becomes invalid.

Otherwise, when the pull-up and pull-down signals, PLLUP and PLLDN, are at high level, the third transistor 302 is turned off while the fourth transistor 304 is turned on. Thereby, the voltage level of the output node Nout goes to the level of the ground voltage VSS and the last output data ODATA becomes a low value.

When the pull-up and pull-down signals, PLLUP and PLLDN, are at low level, the third transistor 302 is turned on while the fourth transistor 304 is turned off. Thereby, the voltage level of the output node Nout goes to the level of the second drive voltage Vdrv_2 and the last output data ODATA becomes a high value.

Figure 6:
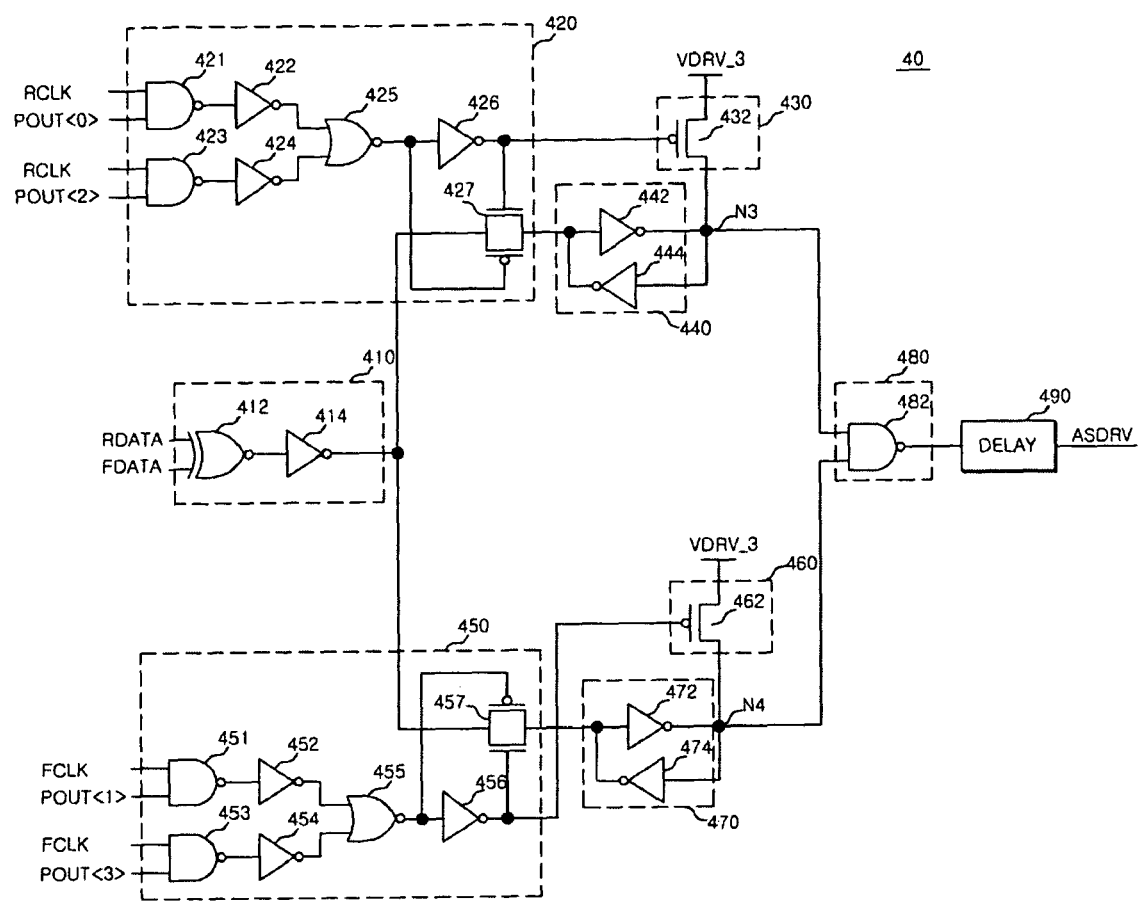
FIG. 6 is a circuit diagram illustrating a detailed structure of the assistant pre-driver shown in FIG. 3.

FIG. 6 is a circuit diagram illustrating a detailed structure of the assistant pre-driver 40 shown in FIG. 3.

The assistant pre-driver 40 includes a comparing section 410, a fifth switching section 420, a sixth switching section 430, a first latch section 440, a seventh switching section 450, an eighth switching section 460, a second latch section 470, a signal combining section 480, and a delay section 490. The comparing section 410 determines whether the rising data RDATA agrees with the falling data FDATA in logical value. The fifth switching section 420 passes an output signal of the comparing section 410 therethrough in accordance with the voltage levels of the rising clock RCLK, the pipe output control signals POUT<0> and POUT<2>. The sixth switching section 430 supplies a third drive voltage Vdrv_3 to a node N3 in accordance with the voltage levels of the rising clock RCLK, the pipe output control signals POUT<0> and POUT<2>. The first latch section 440 temporarily stores the output signal of the comparing section 410, which passes through the fifth switching section 420, and transfers an inverted signal of the comparing section 410 output signal to the node N3. The seventh switching section 450 passes an output signal of the comparing section 410 therethrough in accordance with the voltage levels of the falling clock FCLK, the pipe output control signals POUT<1> and POUT<3>. The eighth switching section 460 supplies the third drive voltage Vdrv_3 to a node N4 in accordance with the voltage levels of the falling clock FCLK, the pipe output control signals POUT<1> and POUT<3>. The second latch section 470 temporarily stores the output signal of the comparing section 410, which passes through the seventh switching section 450, and transfers an inverted signal of the comparing section output signal to the node N4. The signal combining section 480 combines the signals applied to the nodes N3 and N4. The delay section 490 outputs the assistant drive signal ASDRV by delaying an output signal of the signal combining section 480.

The comparing section 410 includes an exclusive NOR (XNOR) gate 412 outputting a low-level signal when the rising data RDATA is different from the falling data FDATA in logical value, and a tenth inverter 414 logically inverting an output signal of the XNOR gate 412.

The fifth switching section 420 includes a first NAND gate 421 receiving the rising clock RCLK and the pipe output control signal POUT<0>; an eleventh inverter 422 logically inverting an output signal of the first NAND gate 421; a second NAND gate 423 receiving the rising clock RCLK and the pipe output control signal POUT<2>; a twelfth inverter 424 logically inverting an output signal of the second NAND gate 423; a first NOR gate 425 receiving output signals of the eleventh and twelfth inverters 422 and 424; a thirteenth inverter 426 logically inverting an output signal of the first NOR gate 425; and a fifth pass gate 427 receiving output signals of the thirteenth inverter 426 and the first NOR gate 425 through its gate terminals, and then passing the output signal of the comparing section 410 when the output signal of the first NOR gate 425 is low level.

The sixth switching section 430 includes a fifth transistor with its gate terminal receiving the output signal of the thirteenth inverter 426 of the fifth switching section 420, its source terminal supplied with the third drive voltage Vdrv_3, and its drain terminal connected to the node N3.

The first latch section 440 is composed of a fourteenth inverter 442 logically inverting an output signal of the fifth pass gate 427 of the fifth switching section 420 and transferring the inverted output signal of the fifth pass gate 427 to the node N3; and a fifteenth inverter 444 constituting a latch structure with the fourteenth inverter 442.

The seventh switching section 450 is composed of a third NAND gate 451 receiving the falling clock FCLK and the pipe output control signal POUT<1>; a sixteenth inverter 452 logically inverting an output signal of the third NAND gate 451; a fourth NAND gate 453 receiving the falling clock FCLK and the pipe output control signal POUT<3>; a seventeenth inverter 454 logically inverting an output signal of the fourth NAND gate 453; a second NOR gate 455 receiving output signals of the sixteenth and seventeenth inverters 452 and 454; an eighteenth inverter 456 logically inverting an output signal of the second NOR gate 455; and a sixth pass gate 457 receiving output signals of the eighteenth inverter 456 and the second NOR gate 455 through its gate terminals and then passing the output signal of the comparing section 410 when the output signal of the second NOR gate 455 is low level.

The eighth switching section 460 includes a sixth transistor 462 with its gate terminal receiving the output signal of the eighteenth inverter 456 of the seventh switching section 450, its source terminal supplied with the third drive voltage Vdrv_3, and its drain terminal connected to the node N4.

The second latch circuit 470 is composed of a nineteenth inverter 472 logically inverting an output signal of the sixth pass gate 457 of the fifth switching section 450 and transferring the inverted output signal of the sixth pass gate 457 to the node N4, and a twentieth inverter 474 constituting a latch structure with the nineteenth inverter 472.

The signal combining section 480 includes a fifth NAND gate 482 receiving the signals transferred to the nodes N3 and N4.

The third drive voltage Vdrv_3 is provided to define the voltage level of the assistant drive signal ASDRV output from the delay circuit 490. The third drive voltage Vdrv_3 may be implemented by the external power supply voltage, but is not limited hereto.

When the rising clock RCLK and the pipe output control signal POUT<0> are activated at the same time, or when the rising clock RCLK and the pipe output control signal POUT<2> are activated at the same time, the fifth pass gate 427 of the fifth switching section 420 is turned on. When this occurs, since the falling clock FCLK is inactivated, the fifth transistor 432 of the sixth switching section 430 is turned off while the sixth transistor 462 of the eighth switching section 460 is turned on. Thereby, the third drive voltage Vdrv_3 is applied to the node N4.

The voltage applied to the node N3 is influenced by whether the rising data RDATA is identical to the falling data FDATA in logical value. If the logical value of the rising data RDATA is the same as the falling data FDATA, the XNOR gate 412 of the comparing section 410 outputs a high-level signal. This high-level signal is transferred to the node N3 through the tenth inverter 414 of the comparing section 410 and the fourteenth inverter 442 of the first latch section 440, so that the node N3 is charged with a voltage of high level. As the voltage levels applied to the nodes N3 and N4 are high, an output signal of the fifth NAND gate 482 of the signal combining section 480 becomes low level. Thus, the assistant drive signal ASDRV generated from the output signal of the fifth NAND gate 482 is at low level, i.e., inactivated.

Meanwhile, if the logical value of the rising data RDATA is different from the falling data FDATA, the XNOR gate 412 of the comparing section 410 outputs a low-level signal. This low-level signal is transferred to the node N3 through the tenth inverter 414 of the comparing section 410 and the fourteenth inverter 442 of the first latch section 440, so that the node N3 is supplied with a voltage of low level. As the node N3 is set at a low voltage level while the node N4 is set at a high voltage level, an output signal of the fifth NAND gate 482 of the signal combining section 480 becomes high level. Thus, the assistant drive signal ASDRV generated from the output signal of the fifth NAND gate 482 is at high level, i.e., activated.

Also, when the falling clock FCLK and the pipe output control signal POUT<I> are activated, or when the falling clock FCLK and the pipe output control signal POUT<3> are activated, the sixth pass gate 457 of the seventh switching section 450 is turned on. When this occurs, since the rising clock RCLK is inactivated, the fifth pass gate 427 of the fifth switching section 420 is turned off. The sixth transistor 462 of the eighth switching section 460 is turned off and the fifth transistor 432 of the sixth switching section 430 is turned on. Thereby, the third drive voltage Vdrv_3 is applied to the node N3.

A voltage applied to the node N4 is influenced by whether the rising data RDATA is identical to the falling data FDATA in logical value. If the logical value of the rising data RDATA is the same as the falling data FDATA, the XNOR gate 412 of the comparing section 410 outputs a high-level signal. This high-level signal is transferred to the node N4 through the tenth inverter 414 of the comparing section 410 and the nineteenth inverter 472 of the second latch section 470, so that the node N4 is charged with a voltage of high level. As the potential levels applied to the nodes N3 and N4 are high, an output signal of the fifth NAND gate 482 of the signal combining section 480 becomes low level. Thus, the assistant drive signal ASDRV generated from the output signal of the fifth NAND gate 482 is at low level, i.e., inactivated.

Meanwhile, if the logical value of the rising data RDATA is different from the falling data FDATA, the XOR gate 412 of the comparing section 410 outputs a low-level signal. This low-level signal is transferred to the node N4 through the tenth inverter 414 of the comparing section 410 and the nineteenth inverter 472 of the second latch section 470, so that the node N4 is supplied with a voltage of low level. As the node N3 is set at a high voltage level while the node N4 is set at a low voltage level, an output signal of the fifth NAND gate 482 of the signal combining section 480 becomes high level. Thus, the assistant drive signal ASDRV generated from the output signal of the fifth NAND gate 482 is at high level, i.e., activated.

The delay section 490 delays an output signal of the signal combining section 480 so the operational timing of the output signal of the signal combiner 480 agrees with the pull-up and pull-down signals PLLUP and PLLDN output from the pre-driver 20.

Figure 7:
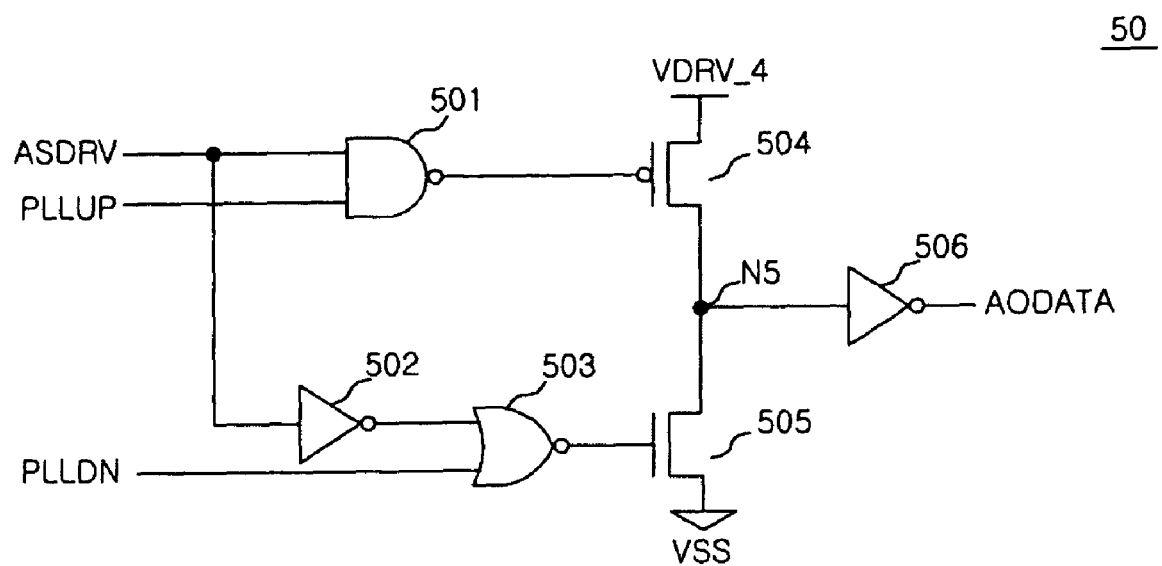
FIG. 7 is a circuit diagram illustrating a detailed structure of the assistant main driver shown in FIG. 3.

FIG. 7 is a circuit diagram illustrating a detailed structure of the assistant main driver 50 shown in FIG. 3.

The assistant main driver 50 includes a sixth NAND gate 501, a twenty-first inverter 502, a third NOR gate 503, a seventh transistor 504, an eighth transistor 505, and a twenty-second inverter 506. The sixth NAND gate 501 receives the assistant drive signal ASDRV from the assistant pre-driver 40 and the pull-up signal PLLUP from the pre-driver 20. The twenty-first inverter 502 logically inverts the assistant drive signal ASDRV. The third NOR gate 503 receives an output signal of the twenty-first inverter 502 and the pull-down signal PLLDN output from the pre-driver 20. The gate terminal of the seventh transistor 504 receives an output signal of the sixth NAND gate 501, the source terminal is supplied with a fourth drive voltage Vdrv_4, and the drain terminal is connected to a node N5. The gate terminal of the eighth transistor 505 receives an output signal of the third NOR gate 503, the source terminal is supplied to the ground voltage VSS, and the drain terminal connected to the node N5. The twenty-second inverter 506 outputs the assistant last output data AODATA by logically inverting a voltage applied to the node N5.

The fourth drive voltage Vdrv_4 is provided to define the voltage of the high level for the assistant last output data AODATA output through the twenty-second inverter 506. The fourth drive voltage Vdrv_4 may be implemented by the external power supply voltage, but is not limited hereto.

If the assistant drive signal ASDRV is inactivated, the seventh and eighth transistors 504 and 505 are turned off and the node N5 is in a floating state. Although such a voltage level is driven into the assistant last output data AODATA by way of the twenty-second inverter 506, it is regarded as being invalid for data.

But, if the pull-up and down signals PLLUP and PLLDN are at high level when the assistant drive signal ASDRV is activated, the seventh and eighth transistors 504 and 505 receive low-level signals through their gate terminals. Thus, the fourth drive voltage Vdrv_4 is applied to the node N4 and logically inverted through the twenty-second inverter 506, resulting in assistant last output data AODATA of low value.

Meanwhile, if the pull-up and pull-down signals PLLUP and PLLDN are at low level when the assistant drive signal ASDRV is activated, the seventh and eighth transistors 504 and 505 receive high-level signals through their gate terminals. Thus, the node N4 is supplied with the ground voltage VSS. The voltage (i.e., VSS) of the node N4 is logically inverted through the twenty-second inverter 506, resulting in assistant last output data AODATA of high value.

The last output data ODATA from the main driver 30 is always the same as the assistant last output data AODATA of the assistant main driver 50 in logical value. Therefore, while the last output data ODATA is transitioning in logical level, the last output data ODATA is able to reach a target level in a shorter time because the assistant last output data AODATA is output along with the last output data ODATA.

As mentioned above, when there is a variation in value, i.e., transition of voltage level of the last output data ODATA in the data output circuit, the assistant last output data AODATA is output along with the last output data ODATA by driving the assistant pre-driver 40 and the assistant main driver 50, which enhances the drivability of the data output circuit. Therefore, it is possible to overcome the problem that output data cannot reach a target level in a high-frequency semiconductor memory apparatus.

In summary, the data output circuit and method according to an embodiment of the present invention is advantageous in strengthening drivability, while the last output data transitions in voltage level, by employing the assistant data output driver that operates only during the voltage level transition of the last output data, which makes the output data reach the target level in a shorter time.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data output circuit of a semiconductor memory apparatus, comprising:
    a pre-driver configured to generate pull-up and pull-down signals by driving rising and falling data in active periods of rising and falling clocks, respectively, in response to a state of an output enable signal;
    a common node;
    a main driver configured to generate last output data based on the pull-up and pull-down signals and to output the last output data to the common node;
    an assistant pre-driver configured to generate an assistant drive signal, which is activated when the rising data is different from the falling data, in response to inputs of the rising data, the falling data, the rising clock, the falling clock, and a pipe output control signal; and
    an assistant main driver configured to generate assistant last output data in response to input of the pull-up and pull-down signals and the assistant drive signal and to output the assistant last output data to the common node.

2. The data output circuit as set forth in claim 1, wherein the pre-driver comprises:
    an output enable signal input section configured to determine the start of an operation of the pre-driver in coordination with an input of the output enable signal;
    a first node;
    a first switching section configured to transfer the rising data to the first node in coordination with the input of the rising clock;
    a second switching section configured to transfer the falling data to the first node in coordination with the input of the falling clock;
    a pull-up signal generating section configured to generate the pull-up signal to drive the rising data or falling data that is transferred to the first node;
    a third switching section configured to transfer the rising data to the second node in coordination with the input of the rising clock;
    a fourth switching section configured to transfer the falling data to the second node in coordination with the input of the falling clock; and
    a pull-down signal generating section coupled to the second node and configured to generate the pull-down signal to drive the rising data or falling data that is transferred to the second node.

3. The data output circuit as set forth in claim 2, wherein the output enable signal input section comprises:
    an inverter having an output and configured to invert the output enable signal;
    a first transistor having a gate terminal coupled the output of the inverter, a drain terminal coupled to the first node, and a source terminal that is grounded; and
    a second transistor having a gate terminal configured to receive the output enable signal, a source terminal configured to receive a drive voltage, and a drain terminal coupled to the second node.

4. The data output circuit as set forth in claim 2, wherein the first switching section comprises a pass gate configured to transfer the rising data to the first node based on the rising clock.

5. The data output circuit as set forth in claim 2, wherein the second switching section comprises a pass gate configured to transfer the falling data to the first node based on the falling clock.

6. The data output circuit as set forth in claim 2, wherein the pull-up signal generating section comprises an odd number of inverters, serially connected to each other in an inverter chain having an input the input of the inverter chain coupled to the first node.

7. The data output circuit as set forth in claim 2, wherein the third switching section comprises a pass gate configured to transfer the rising data to the second node based on the rising clock.

8. The data output circuit as set forth in claim 2, wherein the fourth switching section comprises a pass gate configured to transfer the falling data to the second node based on the falling clock.

9. The data output circuit as set forth in claim 2, wherein the pull-down signal generating section comprises an odd number of inverters, serially connected to each other in a inverter chain, an input of the inverter chain coupled to, the second node.

10. The data output circuit as set forth in claim 1, wherein the main driver comprises:
    an output node;
    a first transistor having a gate terminal configured to receive the pull-up signal, a source terminal configured to receive a drive voltage, and a drain terminal coupled to the output node; and
    a second transistor having a gate terminal configured to receive the pull-down signal, a source terminal coupled to a ground voltage, and a drain terminal coupled to the output node.

11. The data output section as set forth in claim 1, wherein the assistant pre-driver comprises a comparing section configured to determine whether the rising data is the same as the falling data in logical value and to provide an output signal.

12. The data output circuit as set forth in claim 11, wherein the assistant pre-driver further comprises:
    a first node;
    a second node;
    a first switching section configured to pass the output signal of the comparing section in accordance with the voltage levels of the rising clock and the pipe output control signal;
    a second switching section configured to supply a drive voltage to the first node in accordance with the voltage levels of the rising clock and the pipe output control signal;
    a first latch section configured to receive the output signal of the comparing section from the first switching section and to temporarily store and transfer the output signal of the comparing section to the first node;

a third switching section configured to pass the output signal of the comparing section in accordance with the voltage levels of the falling clock and the pipe output control signal;

a fourth switching section configured to supply the drive voltage to the second node in accordance with the voltage levels of the falling clock and the pipe output control signal;

a second latch section configured to receive the output signal of the comparing section from the third switching section and to temporarily store and transfer the output signal of the comparing section to the second node;

a signal combining section configured to combine the signals applied to the first and second nodes and generate an output signal based thereon; and a delay section configured to generate an assistant drive signal from the output signal of the signal combining section delayed by a predetermined time.

13. The data output circuit as set forth in claim 11, wherein the comparing section comprises an exclusive NOR gate configured to receive the rising data and falling data as input and to generating a low-level signal when the rising data disagrees with the falling data in logical value and generate a high-level signal when the rising data agrees with the falling data in logical value.

14. The data output circuit as set forth in claim 12, wherein the first switching section comprises:
a NAND gate configured to receive the rising clock and the pipe output control signal as inputs and to generate an output signal based thereon;
a first inverter configured to invert the output signal of the NAND gate and generate an output signal; and
a pass gate coupled to the comparing section and having gate terminals configured to receive, respectively, the output signals of the inverter and the NAND gate and to pass as its output the output signal of the comparing section when the output signal of the NAND gate is low level.

15. The data output circuit as set forth in claim 14, wherein the second switching section comprises a transistor having a gate terminal configured to receive the output signal of the first inverter, a source terminal configured to receive the drive voltage, and a drain terminal coupled to the first node.

16. The data output circuit as set forth in claim 14, wherein the first latch section comprises:
a second inverter having an input configured to receive the output of the pass gate and an output coupled to the first node; and
a third inverter configured to constitute a latch structure with the second inverter.

17. The data output circuit as set forth in claim 12, wherein the third switching section comprises:
a NAND gate configured to receive the falling clock and the pipe output control signal as inputs and to generate an output signal based thereon;
a first inverter configured to invert the output signal of the NAND gate and to generate an output signal; and
a pass gate coupled to the comparing section and having gate terminals configured to receive, respectively, the output signals of the inverter and the NAND gate and to pass as its output the output signal of the comparing section when the output signal of the NAND gate is low level.

18. The data output circuit as set forth in claim 17, wherein the fourth switching section comprises a transistor having a gate terminal configured to receive the output signal of the first inverter, a source terminal configured to receive the drive voltage, and a drain terminal coupled to the second node.

19. The data output circuit as set forth in claim 17, wherein the second latch section comprises:
a second inverter having an input configured to receive the output of the pass gate and an output coupled to the second node; and
a third inverter configured to constitute a latch structure with the second inverter.

20. The data output circuit as set forth in claim 12, wherein the signal combining section is comprise a NAND gate having inputs coupled the first and second nodes.

21. The data output circuit as set forth in claim 1, wherein the assistant main driver comprises:
a NAND gate configured to receive the assistant drive signal and the pull-up signal as inputs and having an output;
an inverter configured to invert the assistant drive signal and generate an output signal;
a NOR gate configured to receive the output signal of the inverter and the pull-down signal as inputs and generate an output based thereon;
a first transistor having a gate terminal coupled to the output of the NAND gate, a source terminal configured to receive a drive voltage, and a drain terminal coupled to an output terminal; and
a second transistor having a gate terminal coupled to the output of the NOR gate, a source terminal coupled to ground, and a drain terminal coupled to the output terminal.

22. The data output circuit as set forth in claim 1, wherein the rising and falling data are activated and transferred to the pre-driver and the assistant pre-driver alternately.

23. The data output circuit as set forth in any one of claims 3, 10, 12, and 21, wherein the drive voltage is an external power supply voltage.

* * * * *